US005707748A

United States Patent [19]

Bergmann

[11] Patent Number: 5,707,748
[45] Date of Patent: Jan. 13, 1998

[54] COATED TOOL WITH INCREASED SERVICE LIFE

[75] Inventor: Erich Bergmann, Mels, Switzerland

[73] Assignee: Balzers AG, Balzers, Liechtenstein

[21] Appl. No.: 623,511

[22] Filed: Mar. 28, 1996

Related U.S. Application Data

[63] Continuation of Ser. No. 266,987, Jun. 28, 1994, abandoned.

[30] Foreign Application Priority Data

Jul. 21, 1993 [CH] Switzerland ............... 02 200/93

[51] Int. Cl.$^6$ ................................................ B32B 18/00
[52] U.S. Cl. ............... 428/469; 428/215; 428/472; 428/698; 428/699
[58] Field of Search ................... 428/698, 699, 428/472, 469, 215, 218, 212, 408, 688, 689

[56] References Cited

U.S. PATENT DOCUMENTS

| | | | |
|---|---|---|---|
| Re. 34,035 | 8/1992 | Dimigen | 428/244 |
| 3,900,592 | 8/1975 | Kennedy | 427/39 |
| 3,959,557 | 5/1976 | Berry | 428/368 |
| 4,169,913 | 10/1979 | Kobayashi | 428/217 |
| 4,442,169 | 4/1984 | Graham | 428/332 |
| 4,645,715 | 2/1987 | Ovshinsky | 428/469 |
| 4,734,339 | 3/1988 | Schachner | 428/701 |
| 4,992,153 | 2/1991 | Bergmann et al. | 204/192.16 |
| 5,075,181 | 12/1991 | Quinto | 428/698 |
| 5,116,694 | 5/1992 | Tsukada | 428/698 |
| 5,223,337 | 6/1993 | van den Berg | 428/336 |
| 5,260,107 | 11/1993 | Kawamura | 427/577 |
| 5,266,388 | 11/1993 | Santhanam | 428/212 |

*Primary Examiner*—Timothy Speer
*Attorney, Agent, or Firm*—Notaro & Michalos P.C.

[57] ABSTRACT

A tool with at least one area which is to be exposed to wear, is coated in a vacuum process with a first hard coating lying directly on the tool material and a superimposed exterior friction reducing layer over the hard coating. The grain size of the hard and friction reducing layers has a linear average width of less than 1 μm.

17 Claims, No Drawings

COATED TOOL WITH INCREASED SERVICE LIFE

This application is a continuation, of application Ser. No. 08/266,987, filed Jun. 28, 1994 now abandoned.

FIELD AND BACKGROUND OF THE INVENTION

The present invention refers to a coated tool.

Tools for the cutting and forming operations of metals as well as of plastics, are often coated to increase their service life and to improve the operational conditions. Known procedures such as CVD or PVD are used for coating the tools. The layers used are hard layers which usually are formed by nitrides, carbides or carbonitrides of titanium or hafnium or zirconium or their alloys. The variety of use of such coated tools, for example, are mentioned in the following publications: "Proceedings of the 13th Plansee-Seminar", Plansee, May 1993; and "Proceedings of the 20th International Conference on Metallurgical Coatings", San Diego, Apr. 1993.

With the work of some materials, these layers do not always lead to a desired result, especially if the materials tend to form built-up cutting edges. This, on the one hand, refers to materials with strong galling tendency such as aluminium and titanium alloys, or materials which tend to undergo a strong strain hardening, such as austenitic stainless steels or brass. The damage depends on the tool type. With cutting tools, one observes built-up cutting edges which, on the one hand, lead to an increased adhesive wear when being torn, and which on the other hand, have a negative influence on the tool's quality.

For forming tools, the hard coatings also achieve a reduction in friction. Even with such coatings, however, a loss of this friction reduction is possible, if any cold welds or smears arise on the tool surface. With tools which would not be suited for such operations, if they were not coated, this, for instance, leads to failure, mostly by breaking or with others it leads to lower service life, to increased cleaning or maintenance requirements or to a reduced work piece quality. To reduce or avoid these problems the solution often referred to and known with uncoated tools, is to improve the lubrication used. Oils or emulsions for instance, are improved by the development of titanium nitrideophile cutting liquids. Apparative modifications on the machine or new tool designs are used to improve the lubricator supply. Especially with punching and deep drawing, a pretreatment of the work piece material is considered. These possibilities, however, have been heavily exhausted and other possibilities are more and more restricted due to efforts related to environmentally adapted manufacturing techniques. The possibilities to develop further improvements with hard materials are also restricted. Since the improved titanium carbonitride coating was introduced on the market, no further huge progressive steps were made in this field.

The commonly used lubricants in the field of machine engineering, such as molybdenum disulfide and diamond-like carbon, does not prove to be good with cutting tools. It showed repeatedly that coatings of this kind have no sufficient abrasion resistance and in addition have no sufficient resistance against shearing. The coated tool is too quickly worn, and no meaningful increase to service life occurs.

Another solution suggested to solve the problem was to use multilayers, e.g. see EP Patent 0 170 359 and French Patent 2 596 775. In French Patent 2 596 775 it is suggested to coat a tool with a titanium nitride layer superposed by a final layer consisting of I-carbons. For cutting tool coatings, the suggested solution is not usable, because layer deposition is only possible at lower temperatures, typically 200° C. In addition, the adhesion of layers for cutting tools deposited at such low temperatures is not sufficient. In EP 0 170 359 it is suggested to coat the tool with very thin multilayer systems. Once these layers are worn partially, however, this leads to a tool surface where different zones are covered with different layers. During practical applications, this causes various problems. This solution thus, can only be used on surfaces where a planar smoothing by wear takes place. With tools, this is normally not the case. The wear mainly occurs at an inclination, away from the cutting edge. The layers thus are not worn in a planar manner, but are ground to a wedge by the cutting operation. Under these conditions multilayers tend to exfoliate, i.e. the result either is an interlammelar breakdown or a cohesive breakdown within the layers, which should have functioned as lubricants. The reason for this is that the materials have not enough tensile strength. The result is a surface or a staircase effect, which is almost exclusively formed by hard materials. The suggested solutions thus do not effect the desired success.

In U.S. Pat. No. 4,992,153 (EP 0 394 661), the use of carbonic friction reducing layers is described. Layer systems with especially good characteristics for special tool applications are not disclosed in this reference, however.

SUMMARY OF THE INVENTION

It is the task of the present invention to avoid or prevent the disadvantages in the prior art. The main intention is to suggest a layer system for cutting tools which would normally tend to form built-up edges, but which lead to an increased service life, with a high operational quality and with a high economy of the coating procedure.

An object of the present invention is to solve the prior art problems by providing a tool which, at least at surfaces to be exposed to wear, is coated by vacuum procedure where the coating consists of at least one hard layer, lying directly on the tool, and at least one superimposed exterior friction reducing layer, where the grain sizes of the individual layers have a linear average width of less than 1 µm.

In accordance with the present invention, a tool is coated with a hard layer and then with a friction reducing layer. The coating is made by known vacuum deposition procedures like PVD procedures such as evaporation, ion plating and sputtering. The desired layer composition is adjusted as is known, by supplying reactive gases into the process. Mixed forms of the described process are of course also possible. Especially relevant are hard coatings consisting of a metal carbide, a metal nitride or a carbon nitride or its combinations. Suited metals for example are titanium, hafniumor zirconium or alloys consisting mainly of these elements together with other metals as well as their combinations. The process conditions are selected in a way that the hard coating preferably is under a compressive internal stress higher than 0.2 Gigapascal. The layer deposited by a PVD procedure has grain sizes with an average linear width smaller than 1 µm. The exact adjustment of the layer parameter depends on the individual case. Good results, for instance, are reached with a hard layer thickness of about 4 µm for spiral drills, 3 µm for shank-type cutters and 6 µm for punches. In certain cases it is, however, possible due to economic or procedural reasons to choose lower layer thicknesses; they should, however, not go below 1.1 µm. The choice of the compounds and the alloy for the hard coating can be based on the known considerations, e.g. the alloying of aluminium, silicon or zirconium, to enhance the temperature resistance or e.g. the use of carbon nitrides to increase the hardness.

For the friction reducing layer an importantly lower layer thickness is needed. Usually approximately a third of the hard coating thickness is suitable. The practical range then is between about 0.12 to 1.6 μm. Especially suited material for the friction reducing layer are layers based on carbon. Compounds of carbides with carbon such as wolfram carbide with carbon (WC/C) with a total carbon share higher than 61 at% are especially suited. But also other carbides, e.g. the ones from chromium, silicon and titanium are suited, as well as combinations thereof are possible.

The procedures to produce such layers separately are known, e.g. from U.S. Pat. No. 4,992,153 of which the content is herein declared to be an integral part of this description.

This kind of friction reducing material produced together with the corresponding PVD procedures, result in typical grain sizes with an average linear width of less than 0.1 μm. Since not only the hard layer but also the friction reducing layer are produced by a PVD procedure, they can both be deposited easily and economically, one after the other, in one and the same machine. It is also possible to foresee multi-layers or changing layers according to the present invention, depending on the application for the tool.

The various features of novelty which characterize the invention are pointed out with particularity in the claims annexed to and forming a part of this disclosure. For a better understanding of the invention, its operating advantages and specific objects obtained by its uses, reference is made to the accompanying descriptive matter in which a preferred embodiment of the invention is illustrated.

DESCRIPTION OF THE PREFERRED EMBODIMENT

The invention will now be explained by means of examples.

EXAMPLE 1

The comparison was made between high-speed steel S6-5-2 finishing cutters, each with a diameter of 16 mm and an ISO 1641/1 type N.0110 geometry. The treatment consisted of facing an aluminium alloy Avional 100 (AlCuMg1) fully aged. The following cutting conditions were chosen: Cutting speed 240 m/min; Feed 0.3 mm/tooth; Slit depth 16 mm. Three samples were tested:

| | | |
|---|---|---|
| a) | not coated | RA = 4.1 μm |
| b) | coated with 3 μm TiN | RA = 9.1 μm |
| c) | coated with 2.3 μm WC/C | RA = 2.1 μm |
| d) | coated with 3 μm TiN + 1.0 μm WC/C (72 at % C) | RA = 2.1 μm |

(RA stands for the average roughness value)

The c) sample which was coated with WC/C, lost its advantages compared to uncoated milling cutters by wear of the coating on the open space after 10 minutes, i.e. the coating was gone and led to an average roughness value of 4.1 μm. The b) sample which was only coated with titanium nitride even shows higher roughness values than the uncoated a) sample. The comparison related to the surface quality of the workpiece which was expressed by the average roughness.

In a fourth test d), the same milling cutter first was coated with 3 μm TiN, afterwards with a top layer of 1.0 μm WC/C. The top layer had a total carbon share of 72 at%. The milling cutter coated in this way also reached a surface quality of 2.1 μm like the once coated sample c) with the WC/C layer. The service life which could be reached with this improved surface quality, however, was now 100 minutes, which means a drastic increase over the c) sample cutter.

EXAMPLE 2

In another test, drilling in stainless steel was tested. The drills used were high-speed steel 42 helicoidal drills with a diameter of 6 mm. The treatment chosen was the drilling of 30 mm deep blind holes in stainless steel AISI 316. The cutting speed was 6 m/min., the feed was 0.05 mm per turn. The results:

| lot | coating materials | method | layer thickness [μm] | service life [no. of holes] |
|---|---|---|---|---|
| A | none | | | 50 |
| B | Ti(C, N) | H-ion-plating | 5 | 90 |
| C | TiN + WC/C (55 at % C) | H-ion-plating, sputter CVD | 3 2 | 80 |
| D | (Ti, Al)N | cathode sputtering | 5 | 70 |
| E | (TiAlV6)N + CrC/C (70 at % C) | cathode sputt. sputter CVD | 3.5 1.5 | 140 |
| F | TiN + WC/C (65 at % C) | H-ion-plating sputter CVD | 5 0.1 | 100 |

(H-ion plating = High current plasma beam ion plating)

The A lot was not coated and reached a service life of 50 holes. The B lot was coated by high current plasma beam ion plating either with TiC or TiN, with a layer thickness of 5 μm. The service life reached was 90 holes. The C lot was coated by high current plasma beam ion plating with a hard titanium nitride layer, on top of it was laid a WC/C with 55 at% carbide by means of sputter CVD. The hard layer was 3 μm thick, the WC/C layer was 2 μm thick. The service life reached was 80 holes. The D lot was coated with (Ti, Al)N by means of cathode sputtering. The service life reached was 70 holes. Only the layer systems E and F according to the invention, showed an important service life increase with a good cutting quality. With lot E a 3.5 μm thick hard layer of (TiAlV6)N was deposited by means of cathode sputtering, superposed was a 1.5 μm thick friction reducing layer of CrC/C with 70 at% carbon deposited by means of sputter CVD; reaching a service life of 140 holes. The second layer system F according to the invention consists of a 5 μm thick hard layer of TiN deposited by high current plasma beam ion plating and a super-imposed 0.1 μm thick WC/C layer deposited by sputter CVD with 65 at% carbon share. This lead to a service life of 100 holes.

EXAMPLE 3

In a third test series the machining of brass was tested. The drills used were hard metal K40 cooling channel drills with a diameter of 3 mm. The holes drilled were continuous holes in brass CuZn37. The cutting conditions were: Cutting speed 140 m/min.; Feed 0.1 mm per turn. The following results were reached:

| lot | coating materials | method | layer thickness [μm] | service life [no. of holes] |
|---|---|---|---|---|
| A | TiN | H-ion-plating | 2 | 360 000 |
| B | TiN + WC/C (63 at % C) | H-ion-plating sputter CVD | 2 0.1 | 520 000 |
| C | TiN + WC/C (72 at % C) | H-ion-plating, sputter CVD | 4 1 | 510 000 |

(H-ion-plating = High current plasma beam ion plating)

The drill according to lot A, coated with a 2 μm thick TiN hard layer reached a service life of 360 000 holes. The lot B drills with the 2 μm thick TiN and 0.1 μm WC/C with 63 at%C coating according to the invention reached a service life of 520 000 holes. The lot C drills with the other 4 μm thick TiN and 1 μm WC/C with 72 at%C coating according to the invention reached a service life of 510 000 holes.

The afore-mentioned examples show that the layer system according to the invention lead to an improvement increase of the service life of the tool.

While specific embodiments of the invention have been shown and described in detail to illustrate the application of the principles of the invention, it will be understood that the invention may be embodied otherwise without departing from such principles.

What is claimed is:

1. A tool comprising a tool body with at least one area to be exposed to wear and a coating on at least the area to be exposed to wear, which is coated by a vacuum procedure, the coating consists essentially of at least one hard layer lying directly on the tool body, and at least one superimposed exterior friction reducing layer on the hard layer, the friction reducing layer being a mixture of metal carbide and carbon, and being made so as to be free of any halide, a grain size of the hard and friction reducing layers have a linear average width of less than 1 μm, the friction reducing layer also having a lower thickness than the hard layer.

2. A tool according to claim 1, wherein the grain size of the friction reducing layer is less than 0.1 μm.

3. A tool according to claim 2, wherein the hard layer has a compressive internal stress of more than 0.2 Gigapascal.

4. A tool according to claim 2, wherein the tool is for cutting and forming of metal and plastics, and the hard layer consists essentially of at least one of: a metal carbide; a metal nitride; a metal carbonitride of titanium, hafnium and zirconium; and alloys thereof with other metals.

5. A tool according to claim 4, wherein a carbon share of the friction reducing layer is more than 61 at%.

6. A tool according to claim 5, wherein the metal carbide of the friction reducing layer, consists essentially of at least one of: chromium; and wolfram.

7. A tool according to claim 4, wherein the friction reducing layer has a thickness of about ⅓ that of the hard layer, and is about 0.12 μm to 1.6 μm.

8. A tool according to claim 4, wherein the hard layer has a layer thicknesses ranging from about 1.1 μm to 8 μm.

9. A tool according to claim 2, wherein the hard layer consists essentially of one of TiN and $(TiAlV_6)N$, and the friction reducing layer consisting essentially of one of CrC/C and WC/C.

10. A tool according to claim 9, wherein the friction reducing layer has a thickness of about ⅓ that of the hard layer, and is about 0.12 μm to 1.6 μm.

11. A tool according to claim 9, wherein the hard layer has a layer thickness ranging from about 1.1 μm to 8 μm.

12. A tool according to claim 2, wherein the hard layer is TiN and the friction reducing layer is WC/C.

13. A tool according to claim 1, wherein the tool body is for cutting and forming metals and plastics, the carbon share of the friction reducing layer being more than 61 at%.

14. A tool according to claim 13, wherein the metal carbide of the friction reducing layer consists essentially of at least one of: chromium; and wolfram.

15. A tool according to claim 14, wherein the hard layer consists essentially of at least one of: a metal carbide; a metal nitride; a metal carbonitride of titanium, hafnium, and zirconium; and alloys thereof with other metals.

16. A tool comprising tool body with at least one area to be exposed to wear and a coating on at least the area to be exposed to wear, which is coated by a vacuum procedure, the coating consisting essentially of at least one hard layer lying directly on the tool body, the hard layer having a compressive internal stress of more than 0.2 Gigapascal, and at least one superimposed exterior friction reducing layer on the hard layer, the friction reducing layer being a mixture of metal carbide and carbon, a grain size of the hard and friction reducing layers have a linear average width of less than 0.1 μm, the friction reducing layer having a thickness that is less than that of the hard layer, and being about 0.12 μm to 1.6 μm, the hard layer consisting essentially of at least one of, a metal carbide; a metal nitride, a metal carbonitride of titanuim, hafnium, and zirconium; and alloys thereof with other materials; the friction reducing layer, consisting essentially of one of CrC/C and WC/C, and being made so as to be free of any halide.

17. A tool comprising a tool body with at least one area to be exposed to wear and made by the process comprising coating the one area to be exposed to wear with at least one hard layer lying directly on the tool body in a vacuum process, and superimposing on the hard layer an exterior friction reducing layer using physical vapor deposition in the vacuum process, the friction reducing layer being a mixture of metal carbide and carbon, and being made to be free of any halide, a grain size of the hard layer and the friction reducing layer having a linear average width of less than 1 μm, the friction reducing layer also having a lower thickness than the hard layer, the coating on the at least one area of the tool which is exposed to wear consisting essentially of the at least one hard layer and the at least one superimposed exterior friction reducing layer.

* * * * *